United States Patent
Lai

(10) Patent No.: US 9,220,166 B2
(45) Date of Patent: Dec. 22, 2015

(54) METHOD FOR MANUFACTURING LIGHT EMITTING DIODE BACKLIGHT MODULE

(71) Applicant: HON HAI PRECISION INDUSTRY CO., LTD., New Taipei (TW)

(72) Inventor: Chih-Chen Lai, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 374 days.

(21) Appl. No.: 13/900,571

(22) Filed: May 23, 2013

(65) Prior Publication Data

US 2014/0173884 A1 Jun. 26, 2014

(30) Foreign Application Priority Data

Dec. 24, 2012 (TW) .............................. 101149448 A

(51) Int. Cl.
 *H05K 3/34* (2006.01)
 *H05K 1/02* (2006.01)

(52) U.S. Cl.
 CPC .............. *H05K 1/0292* (2013.01); *H05K 3/341* (2013.01); *H05K 2201/10106* (2013.01); *H05K 2203/163* (2013.01); *Y10T 29/49004* (2015.01)

(58) Field of Classification Search
 CPC ................ H05K 1/0292; H05K 3/341; H05K 2203/163; H05K 2201/10106; Y10T 29/49004; Y10T 29/4613; Y10T 29/49144
 USPC ..................... 29/593, 832–834, 840; 257/778; 349/161; 362/294, 373
 See application file for complete search history.

(56) References Cited

U.S. PATENT DOCUMENTS

| | | | |
|---|---|---|---|
| 7,355,285 B2* | 4/2008 | Kobae et al. ................... | 257/778 |
| 7,903,227 B2* | 3/2011 | Kang et al. ..................... | 349/161 |
| 8,950,066 B2* | 2/2015 | Lai .................................. | 29/832 |

* cited by examiner

*Primary Examiner* — Donghai D Nguyen
(74) *Attorney, Agent, or Firm* — Novak Druce Connolly Bove + Quigg LLP

(57) ABSTRACT

A method to manufacture an LED backlight module comprising steps: providing a substrate with circuits arranged thereon; pasting a plurality of LEDs on the substrate; electrically conducting the LEDs with the circuits on the substrate; providing a luminance photometer to measure an illumination of the LEDs in luminous state and getting an actual light intensity distribution of the light of the LEDs through a brightening sheet and a diffusion sheet; providing a computer to detect whether the actual light intensity distribution has a dark/bright band/spot. If the actual light intensity distribution is uniform, the LEDs are soldered to the substrate directly. If there is dark/bright band/spot, the positions of LEDs in connection with the irregular light band/spot are adjusted to enable the light from the LED backlight module to have a uniform intensity distribution.

5 Claims, 5 Drawing Sheets

METHOD FOR MANUFACTURING LIGHT EMITTING DIODE BACKLIGHT MODULE

BACKGROUND

1. Technical Field

The present disclosure generally relates to a method for manufacturing a light emitting diode backlight module, and particularly to a method for manufacturing an LED backlight module which can have a light output of uniform intensity.

2. Description of the Related Art

With developments in semiconductor technology, LEDs are widely used as backlight sources of panels such as liquid crystal displays due to their high light-emitting efficiencies, high brightness and long lifespan.

When the LED is applied to a panel with large-size, a plurality of LEDs are pasted on a printed circuit board (PCB) by surface mount technology (SMT) and then secured on the printed circuit board by soldering. A brightening sheet and a diffusion sheet are usually used to cover the LEDs to increase brightness and uniformity of intensity of light output of an LED backlight module having the LEDs.

However, a brightness of each LED after packaged is difficult to control, which leads to brightness of the LEDs combined together in an LED backlight module can not be kept uniform. In this situation, if the LEDs are still pasted on the pre-location, an actual light output distribution of the backlight module will depart from a desired light output distribution of the backlight module, resulting in defects such as a dark band/spot or bright band/spot.

Therefore, it is desirable to provide a method for manufacturing an LED backlight module which can overcome the shortcoming of the art to obtain an LED backlight module which can have an even distribution of intensity for its light output.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present method to regulate the light emitting module. Moreover, in the drawings, all the views are schematic, and like reference numerals designate corresponding parts throughout the views.

DETAILED DESCRIPTION

Figure 1:
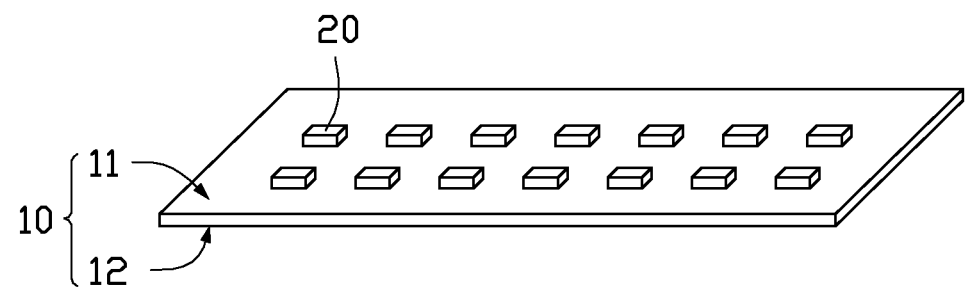
FIGS. 1 to 3 are perspective views showing different steps of a method for manufacturing an LED backlight module in accordance with one embodiment of the present disclosure.
Figure 2:
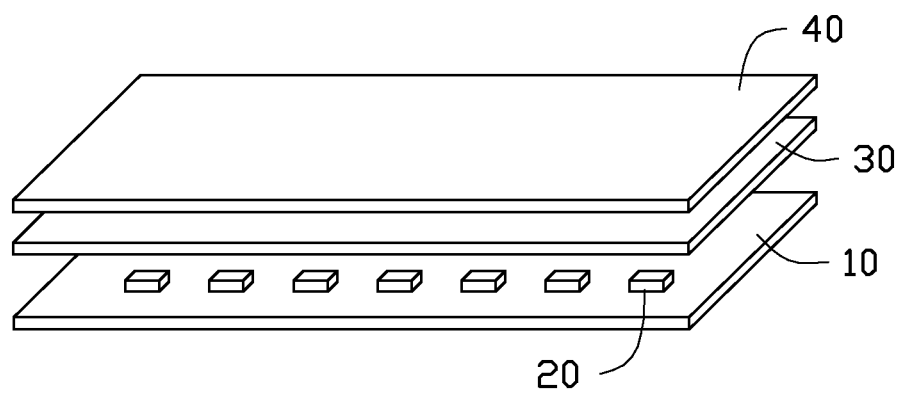
Figure 3:
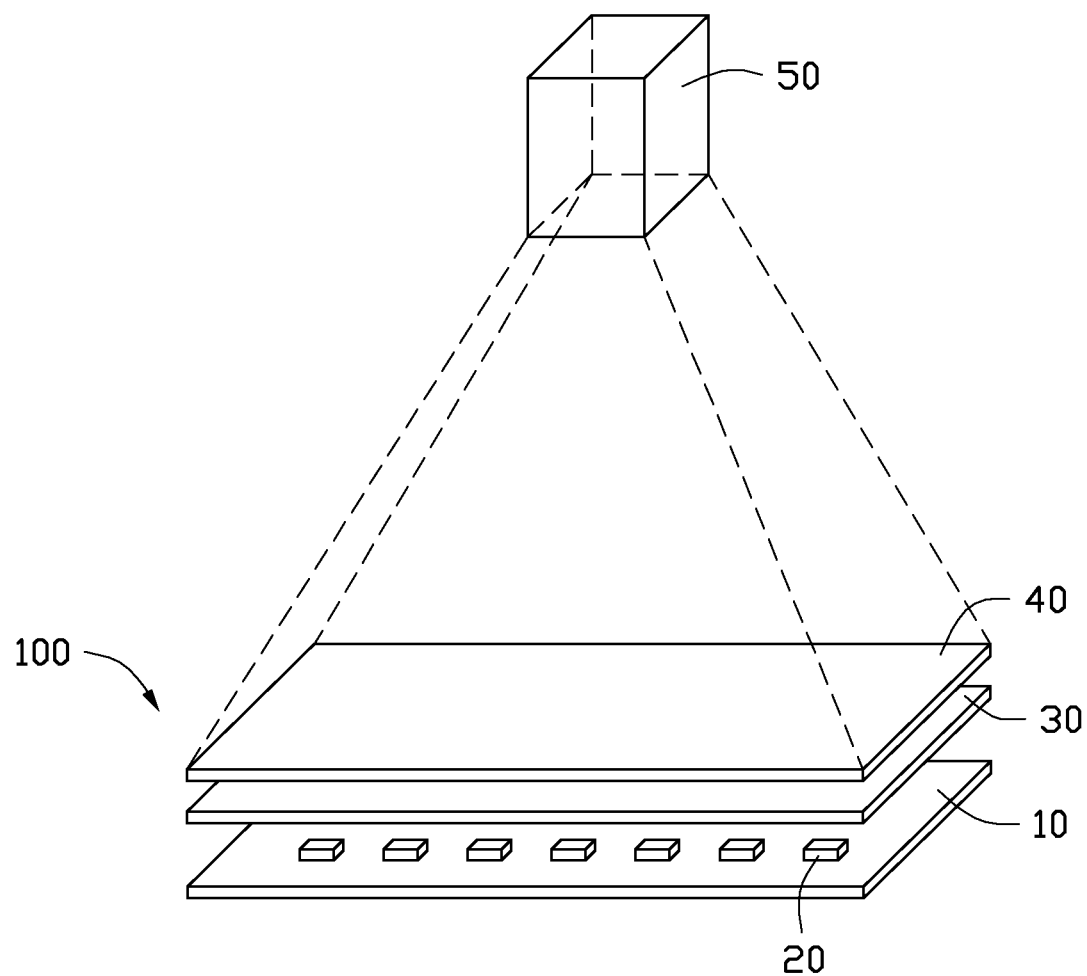

Referring to FIGS. 1 to 4, a method to manufacture a light emitting diode (LED) backlight module 100 in accordance with an embodiment is provided. The LED backlight module 100 includes a substrate 10, a plurality of LEDs 20, a brightening sheet 30 and a diffusion sheet 40 covering the plurality of LEDs 20.

The method includes providing a substrate 10 first. The substrate 10 includes a top surface 11 and a bottom surface 12 opposite to the top surface 11. The top surface 11 is provided with circuits (not shown) arranged thereon. In this embodiment, the substrate 10 is a printed circuit board.

The LEDs 20 are pasted on the top surface 11 of the substrate 10 by surface mounting technology (SMT). Specifically, the LEDs 20 are mounted on the top surface 11 of the substrate 10 by a chip mounter (not shown) whereby the LEDs 20 are positioned to align with predetermined patterned positions of the substrate 10. In the process of the positioning, a CCD (charge coupled device) camera positioned at a fixed position of the chip mounter acquires an image of a shape of each of the LEDs 20. A coordinate of the LED is obtained via digitally processing the image which presents the position of the LED 20, and the position of the LED 20 is initially regulated according to the obtained coordinate in comparison with a predetermined coordinate.

The brightening sheet 30 and the diffusion sheet 40 are successively brought to cover the LEDs 20. Alternatively, the brightening sheet 30 can be replaced by other optical sheet which can be located between the diffusion sheet 40 and the LEDs 20 or located above the diffusion sheet 40. The LEDs 20 are electrically connected to the substrate 10. In this step, the LEDs 20 have not been permanently soldered to the substrate 10 yet; however, the LEDs 20 can emit light by the electrical connection between the LEDs 20 and the circuits of the substrate 10 when power is supplied to the substrate 10.

A luminance photometer 50 is provided. The luminance photometer 50 is disposed above the LED backlight module 100. The luminance photometer 50 measures an illumination of the LED backlight module 100 in luminous state and gets an actual intensity distribution of light emitted by the LEDs 20 and through the brightening sheet 30 and diffusion sheet 40.

Figure 4:
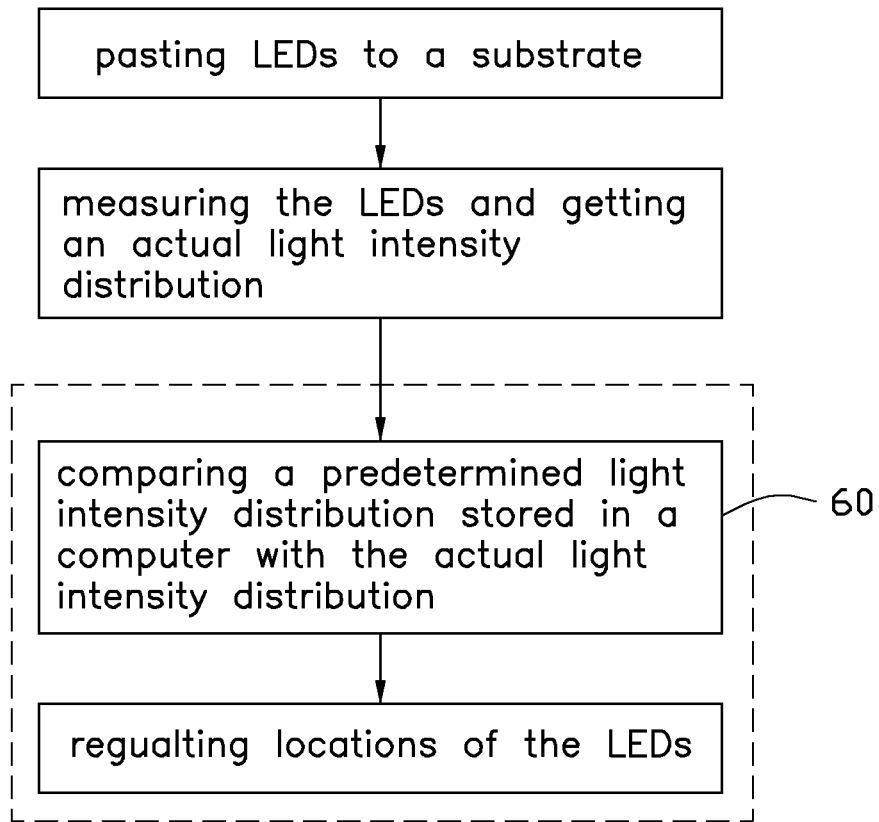
FIG. 4 is a flow chart showing the method for manufacturing the LED backlight module in accordance with the embodiment of the present disclosure.

Step 60 of FIG. 4 includes using a computer with a predetermined intensity distribution of light stored therein. The predetermined intensity distribution of light is formed by measuring an illumination provided by a template of an LED backlight module which has a plurality of standard LEDs mounted on predetermined positions of a substrate whereby the temperate generates light with a uniform intensity distribution.

The actual intensity distribution of light obtained by the luminance photometer 50 is delivered to the computer and compared with the predetermined intensity distribution of light. If there is no difference between the two light intensity distributions or the difference is acceptable (that is, the difference is within a predetermined range), the LEDs 20 are then directly soldered to the substrate 10 to complete the manufacturing of the LED backlight module 100. If there is unacceptable difference between the two light intensity distributions, it means that there are dark or bright bands/spots in the actual intensity distribution of light. The light intensity of these dark or bright bands/spots needs to be compensated. To achieve this, the computer will calculate the required compensation and distance of movement of the LEDs 20 around the LED 20 responsible for the dark or bright bands/spots toward/away from the responsible LED 20. Thereafter, the positions of the LEDs 20 which need to be moved in accordance with the calculation of the computer are relocated accordingly wherein the LEDs 20 are still in electrical connection with the substrate 10 after the adjustment of the positions of the LEDs 20 whose positions need to be adjusted. Finally, the LEDs 20 are soldered to the substrate 10 and then covered by the brightening sheet 30 and diffusion sheet 40 to complete the manufacturing of the LED backlight module 100.

Figure 5:
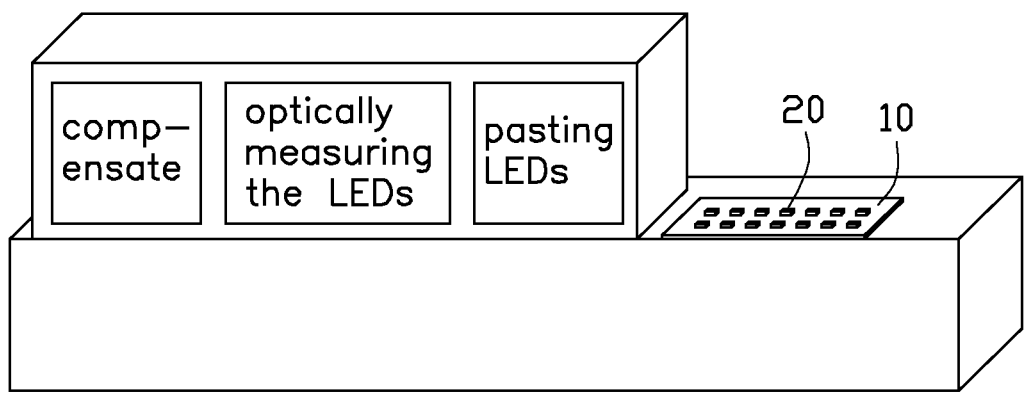
FIG. 5 is a perspective view showing a machine for carrying out the method in accordance with the embodiment of the present disclosure.

Referring to FIG. 5, a machine for carrying out the method for manufacturing the LED backlight module 100 includes three working stations. The first working station is to paste the LEDs 20 to the substrate 10. The second working station includes using the luminance photometer 50 to measure the light intensity distribution obtained by the LED backlight module 100 with the LEDs at the pasted positions. The locations of the LEDs 20 are further adjusted in the third working station to compensate the light intensity of the dark/bright band/spots according to a comparison between the measured light intensity distribution with the predetermined light intensity distribution stored in the computer. The method in accordance with the disclosure can further enhance the uniform distribution of intensity of light generated by the LED backlight module.

It is to be understood that the above-described embodiments are intended to illustrate rather than limit the disclosure. Variations may be made to the embodiments without departing from the spirit of the disclosure. The above-described embodiments illustrate the scope of the disclosure but do not restrict the scope of the disclosure.

What is claimed is:

1. A method to manufacture an LED (light emitting diode) backlight module comprising steps:
   providing a substrate with circuits arranged thereon;
   pasting a plurality of LEDs on the substrate, wherein positions of the plurality of LEDs are movable and the LEDs are in electrical connection with the circuits;
   providing a luminance photometer and measuring an illumination of the LEDs in luminous state and getting an actual intensity distribution of light generated by the LEDs using the luminance photometer;
   providing a computer and detecting whether there is bright or dark band or spot in the actual intensity distribution of light generated by the LEDs using the computer; and
   adjusting locations of the pasted LEDs on the substrate when the computer detects that there is bright/dark band/spot in the actual intensity distribution of light generated by the LEDs to eliminate the detected bright or dark band or spot.

2. The method to manufacture an LED backlight module of claim 1, wherein if the computer detects that there is no bright or dark band or spot in the actual intensity distribution of light generated by the LEDs, the step of adjusting locations of the LEDs is eliminated and the LEDs are soldered to the substrate directly.

3. The method to manufacture an LED backlight module of claim 1, wherein the step of pasting the LEDs on the substrate further comprising using a camera to detect an image of each of the LEDs to decide a coordinate of each of the LEDs on the substrate.

4. The method to manufacture an LED backlight module of claim 3, wherein before the step of providing a luminance photometer to measure an illumination of the LEDs, the LEDs are covered by at least one of a brightening sheet and a diffusion sheet, whereby the luminance photometer measures an illumination of the LEDs through the at least one of a brightening sheet and a diffusion sheet.

5. The method to manufacture an LED backlight module of claim 3, wherein before the step of providing a luminance photometer to measure an illumination of the LEDs, the LEDs are covered by a brightening sheet and then a diffusion sheet, whereby the luminance photometer measures an illumination of the LEDs through the brightening sheet and the diffusion sheet.

* * * * *